United States Patent [19]
Kapka

[11] Patent Number: 5,363,976
[45] Date of Patent: Nov. 15, 1994

[54] SMOKE DETECTOR SECURITY COVER

[76] Inventor: John J. Kapka, 1191 Creekwood Cove, Lawrenceville, Ga. 30245

[21] Appl. No.: 204,625

[22] Filed: Mar. 1, 1994

[51] Int. Cl.$^5$ .............................................. B65D 45/00
[52] U.S. Cl. .................................... 220/3.8; 220/4.02; 220/327
[58] Field of Search .................. 220/327, 3.8, 3.9, 4.02

[56] References Cited

U.S. PATENT DOCUMENTS

| | | |
|---|---|---|
| 1,672,033 | 6/1928 | Mallins . |
| 2,382,428 | 8/1945 | Leuvelink . |
| 2,896,886 | 7/1959 | Slattery . |
| 3,313,599 | 4/1967 | Boon ................... 220/327 |
| 3,319,069 | 5/1967 | Vassil . |
| 3,639,809 | 2/1972 | Phlieger, Jr. ............... 220/327 |
| 3,999,679 | 12/1976 | Kalous ................... 220/327 |
| 4,009,798 | 3/1977 | Pechacek ............... 220/327 |
| 4,424,004 | 1/1984 | Hiskes ................... 220/328 |
| 4,535,863 | 8/1985 | Becker . |
| 4,632,269 | 12/1986 | Rose ................... 220/327 |
| 4,824,066 | 4/1989 | Smith . |
| 4,884,420 | 12/1989 | Finkel et al. . |
| 5,069,371 | 12/1991 | Coleman ............... 220/327 |

Primary Examiner—Joseph Man-Fu Moy
Attorney, Agent, or Firm—James A. Hinkle

[57] ABSTRACT

A smoke-detector security cover has a toroidal base plate attachable to a wall or ceiling surrounding a smoke detector. A toroidal cover plate having a plurality of retainer appendages extended inward radially is connected to the toroidal base plate to cover portions of the smoke detector circumferentially external from a central smoke-detection section of the smoke detector. Attachment rods are extended perpendicularly from the base plate towards the cover plate. Attachment sleeves are extended perpendicularly from the cover plate in sliding contact with the attachment rods telescopically. An anti-theft fastener means is provided in fastener relationship between at least one attachment rod and one attachment sleeve. The anti-theft fastener means can be a split attachment bolt that is tightened in an attachment sleeve with a tapered fastener head or tapered fastener shank. The fastener has an anti-theft head. The anti-theft head can be recessed to further deter unauthorized removal. The anti-theft fastener head can be one that requires a key wrench such as a pin wrench or an off-shaped wrench boss to fit into corresponding pin-wrench holes or an off-shaped wrench socket in order to rotate the fastener head. Optionally, the anti-theft fastener means can be or can include a conventional tumbler lock positioned in locking relationship between an attachment rod and an attachment sleeve to require a key or a combination to disengage.

23 Claims, 5 Drawing Sheets

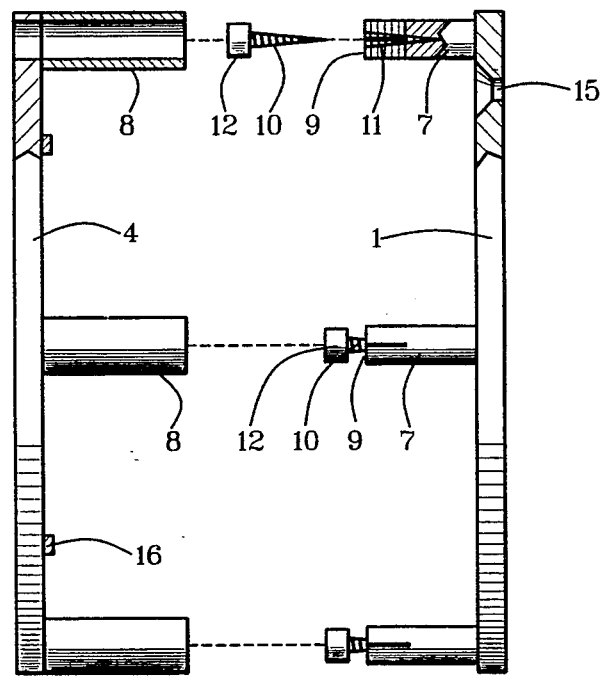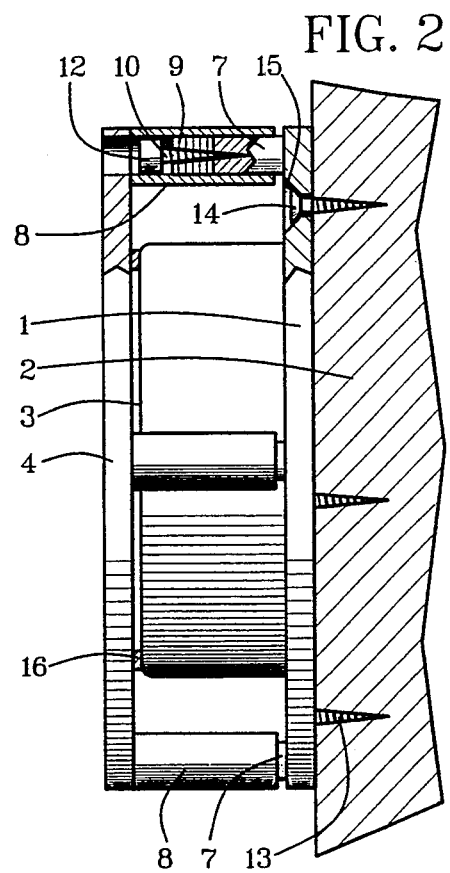

SMOKE DETECTOR SECURITY COVER

BACKGROUND OF THE INVENTION

I. Field of the Invention

The present invention generally relates to the field of covers for protecting smoke detectors and similar objects from vandalism and unauthorized removal of the smoke detector and/or of the batteries.

II. Description of the Prior Art

There is currently no known convenient protection against unauthorized removal of batteries from smoke detectors; or of the detector itself. Children and tenants, particularly in rental apartments and rental homes, often remove batteries from smoke detectors for other uses such as toys and other products. At times the detector themselves are removed from the premises. This leaves the buildings as well as their occupants less protected against fire. In addition to deaths and injuries, costs to owners of buildings and to insurance companies are higher to cover all of the damages which result from undetected fires that could be prevented if the detectors had not been tampered with. It is a serious and prevalent situation.

Anti-theft covers for other types of objects are known but not suitable for smoke detectors. A device for securing a storage battery against theft from vehicles, for instance, was described in U.S. Pat. No. 4,535,863 granted to Becker. The Becker battery cover taught stanchions extended upright from a battery tray to a hinged cover that was fastened down with hexagonal fastener nuts. Finkel et al in U.S. Pat. No. 4,884,420 described a cage for protecting computer equipment with a structure not adaptable to protecting a smoke detector nor deterring unauthorized removal. Leuvelink U.S. Pat. No. 12,3812,4128 taught a camping device for preventing shock to electrical components. Smith in U.S. Pat. No. 4,8124,066 taught an easily accessible apparatus for storing eye corneas of donors. Other known devices are similarly different than taught by this invention.

SUMMARY OF THE INVENTION

In accordance with the present invention, it is contemplated that in light of fire hazards that have existed from unauthorized removal of batteries from smoke detectors and removal of the detectors themselves, objectives of this invention are to provide an anti-theft cover for smoke detectors which:

Can not be removed without a key tool;

Prevents unauthorized access to batteries in a smoke detector:

Can be constructed for aesthetic blending with surrounding structural components; and Does not inhibit detection of smoke by a smoke detector.

An anti-theft cover for smoke detectors to accomplish these objectives has a toroidal base plate attachable to a wall or ceiling surrounding a smoke detector. A toroidal cover plate having a plurality of retainer appendages extended inward radially is connected to the toroidal base plate in a position to cover portions of the smoke detector circumferentially external from a central smoke-detection section of the smoke detector. Attachment rods are extended perpendicularly from the base plate towards the cover plate. Attachment sleeves are extended perpendicularly from the cover plate in sliding contact with the attachment rods telescopically.

An anti-theft fastener means is provided in fastener relationship between at least one attachment rod and one attachment sleeve. The anti-theft fastener means can be a split attachment bolt that is tightened in an attachment sleeve with a tapered fastener head or tapered fastener shank. The fastener has an anti-theft head. The anti-theft head can be recessed to further deter unauthorized removal. The anti-theft fastener head can be one that requires a key wrench such as a pin wrench or an off-shaped wrench boss to fit into corresponding pin-wrench holes or an off-shaped wrench socket in order to rotate the fastener head. Optionally, the anti-theft fastener means can be or can include a conventional tumbler lock positioned in locking relationship between an attachment rod and an attachment sleeve to require a key or a combination to disengage.

Other objects, advantages and capabilities of the invention will become apparent from the following description taken in con, junction with the accompanying drawings showing preferred embodiments of the invention.

BRIEF DESCRIPTION OF THE DRAWINGS

FIG. 1 is a partial cutaway side elevation view showing components of the invention in an assembly sequence;

FIG. 2 is a partial cutaway side elevation view of the invention assembled;

FIG. 3 is an elevation view of a key wrench with two pins on a wrench boss for assembling and disassembling the invention;

FIG. 4 is an end view of a head of a fastener with two pin holes as a key-wrench socket;

FIG. 5 is an end view of an attachment sleeve in which is positioned an attachment rod with a diametrically split end and a tapered screw hole for spreading the attachment sleeve as a means of locking the attachment rod into the attachment sleeve;

FIG. 6 is a side view of an end section of a key wrench with a key-wrench socket as an option to pins on a wrench boss;

FIG. 7 is an end view of a combination key wrench and fastener head with six equal sides;

FIG. 8 is an end view of a combination key wrench and fastener head with five equal sides;

FIG. 9 is an end view of a combination key wrench and fastener head with four equal sides;

FIG. 10 is an end view of a combination key wrench and fastener head with three equal sides;

FIG. 11 is an end view of a combination key wrench and fastener head with five sides with one or more sides being unequal in length to other sides;

DESCRIPTION OF THE PREFERRED EMBODIMENTS

Figure 12:
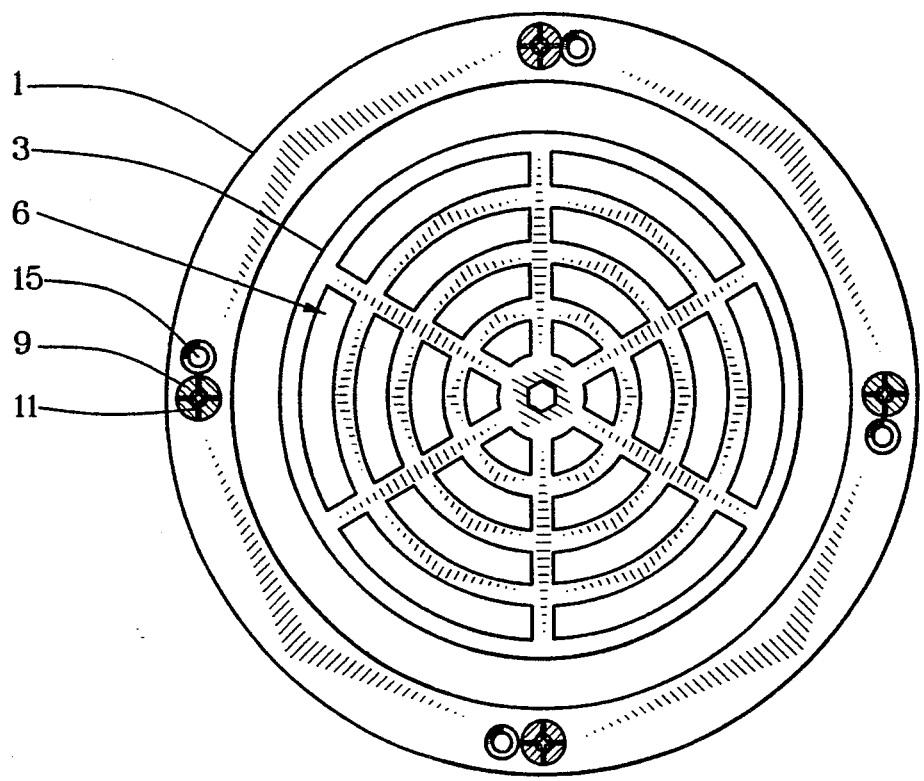
FIG. 12 is a front elevation view of a base plate surrounding a smoke detector.

Referring to the drawings wherein like reference numerals designate corresponding parts throughout the several figures, reference is made first to FIGS. 1-13. A toroidal base plate 1 is attachable to an internal surface 2 of a room at a position surrounding a smoke detector 3. A toroidal cover plate 4 has a plurality of retainer appendages 5, shown in FIGS. 13-14, extended inward radially to positions at which select portions of the retainer appendages 5 cover select portions of the smoke detector 3 circumferentially external from a central smoke-detection section 6 of the smoke detector 3.

The internal surface 2 of the room can be any wall or a ceiling on which a smoke detector 3 is positioned by any conventional means not related to this invention. The smoke detector 3 can be any conventional smoke detector 3. Typically, however, smoke detector 3 is a conventional type that is cylindrical with approximately 3-5 inches diameter and 1-2 inches thickness. Inward from edges of the conventional smoke detector 3, for which this invention is designed primarily, is smoke-detection section 6 with circular inlet channels supported by radial members as a form of screen that is illustrated but not described in relation to this invention.

A plurality of attachment rods 7 extended perpendicularly from the toroidal cover plate 1 and a plurality of attachment sleeves 8 extended perpendicularly from the toroidal cover plate 4 are a means by which the toroidal cover plate 4 is attached to the toroidal base plate 1 in covering relationship to the smoke detector 3. The plurality of attachment sleeves 8 are slid onto the plurality of attachment rods 7 telescopically and locked there with a selection of anti-theft locking means.

The anti-theft locking means in this embodiment includes a split end 9 of at least one, preferably all and in this case four, of the attachment rods 7. The split end 9 is spread circumferentially against an inside periphery of the attachment sleeve 8 by screwing a taper-threaded fastener shank 10 in a taper-threaded fastener hole 11. The split end 9 can be cut diametrically once or twice at right angles as shown. The taper-threaded fastener shank 10 has a fastener head 12 with either of a variety of anti-theft key-wrench sockets as illustrated in FIGS. 4 and 7-11.

The term "fastener" is intended to include either a screw or a bolt. Such fastener can be designed straight or tapered. Within this definition, the terms screw, bolt and fastener can be used interchangeably or in combination. The terms "fastener hole" and "fastener aperture" also are used interchangeably.

"Straight thread" and "straight threaded" are intended to describe a fastener aperture or fastener shank that is not tapered or conical but instead is cylindrical with opposite sides that are parallel in a machine-threaded section of the fastener aperture or fastener shank respectively. Conversely, "taper thread" and "taper threaded" are intended to describe a fastener aperture or fastener shank that is tapered or conical in a machine-threaded section of the fastener aperture or fastener shank respectively.

In FIG. 1, one taper-threaded fastener shank 10 is shown outside of one taper-threaded fastener hole 11 prior to insertion. The other taper-threaded fastener shanks 10 in FIG. 1 are shown screwed less distance into the other taper-threaded fastener holes 11 than in FIG. 2. This illustrates that in FIG. 1, the split ends 9 are not spread, such that the attachment sleeves 8 can be slid onto them telescopically. FIG. 2 illustrates that the split ends 9 are spread tightly against the inside peripheries of the attachment sleeves 8 by screwing the taper-threaded fastener shanks 10 further into the taper-threaded fastener holes 11 in the attachment rods 7.

The toroidal base plate 1 can be attached to the internal surface 2 of the room with wall fasteners 13 having flat heads 14 that are countersunk in countersunk fastener orifices 15 in the toroidal base plate 1. The countersunk fastener orifices 15 can be positioned close enough to the fastener rods 7 to position edges of the flat heads 14 partly under fastener sleeves 8 when the toroidal cover plate 4 is positioned on the toroidal base plate 1. This aids in preventing removal of the assembled toroidal cover plate 4 and toroidal base plate 1 in addition to the anti-theft locking means for locking the cover plate 4 onto the base plate 1.

Cushion pads 16 can be positioned on the retainer appendages 5 to prevent scuffing surfaces of the smoke detectors 4. This feature is advantageous for all embodiments but is particularly significant for an anti-theft locking means described in relation to FIG. 17.

Figure 17:
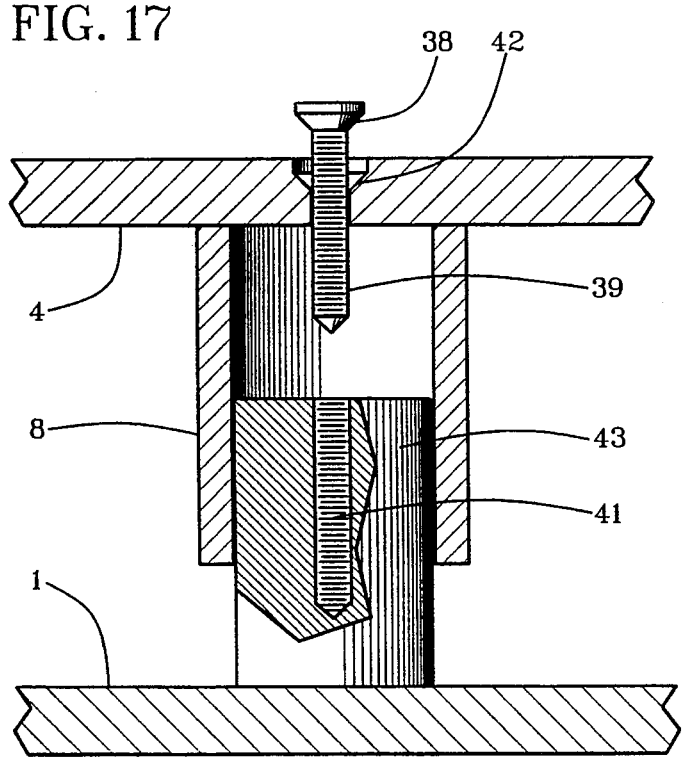
FIG. 17 is a cutaway sectional view of an anti-theft locking means comprising a fastener screw with either type of key-wrench socket described but without a split end of the attachment rod.

Reference is made here to FIGS. 3-11. A key wrench 17, illustrated in FIG. 3, can have either of a selection of key patterns on a wrench boss 18 for rotating either of a selection of fastener shanks that fit into either of a selection of attachment rods 7. The key pattern illustrated in FIG. 17 is a pair of two pins 19 that fit into a pair of two pin holes 20 in a pin-hole fastener head 21 illustrated in FIG. 4. The pin-hole fastener head 21 can be cylindrical like fastener head 12 illustrated in FIGS. 1-2 or tapered as described later in relation to FIGS. 15 and 17. The key wrench 17 can have a wrench shaft 22 that can be inserted in the attachment sleeve 8 with a wrench handle 23 of any desired form.

A representative key-wrench pattern 24 on the wrench boss 18 in FIG. 6 is representative of a side view of either of a selection of key-wrench patterns on wrench bosses 18 in FIGS. 7-11. The illustrations on the left in FIGS. 7-11 are wrench bosses 18 and the illustrations on the right are fastener heads 12 with each wrench boss 18 having a separate key-wrench pattern and each fastener head having a separately matching key-wrench socket respectively as illustrated. The wrench boss 18 in FIG. 7 has a hexagonal key-wrench pattern 25 that fits into a hexagonal key-wrench socket 26 in the fastener head 12. The wrench boss 18 in FIG. 8 has a pentagonal key-wrench pattern 27 that fits into a pentagonal key-wrench socket 28 in fastener head 12. Wrench boss 18 in FIG. 9 has a square key-wrench pattern 29 that fits into a square key-wrench socket 30 in fastener head 12. Wrench boss 18 in FIG. 10 has a triangular key-wrench pattern 31 that fits into a triangular key-wrench socket 32 in fastener head 12. Wrench boss 18 in FIG. 11 has an irregular key-wrench pattern 33 that fits into a matching irregular key-wrench socket 34 in fastener head 12. The irregular key-wrench pattern 33 and matching irregular key-wrench socket 34 in FIG. 11 are five sided but with one or more sides different in length than other sides.

The respective key-wrench patterns 19, 25, 27, 29, 31, and 33 are selected for improbability of their availability to tenants for insertion into key-wrench sockets 20, 26, 28, 30 32, and 34 respectively for removing batteries from smoke detectors 3 without authorization. Some tenants and their family members are likely to have hexagonal Allen wrenches which they could insert in hexagonal socket 26. Almost no one will have a pentagonal object to fit into the pentagonal socket 28. No one will have an irregular five-sided object to fit into the irregular socket 34. But it requires extra costs to have pentagonal and irregular wrench patterns and sockets constructed. Tenants will be deterred by difficulty, not prevented totally from obtaining an object to insert into either socket for removing a battery and, thereby, leaving an owner less protected against fire hazards. But deterrent, not absolute prevention, is the object of almost all lock systems. A reasonable and preferred trade-off of improbability of possession by tenants and low cost of production is the square key-wrench pattern 30 with the square socket 31.

Figure 13:
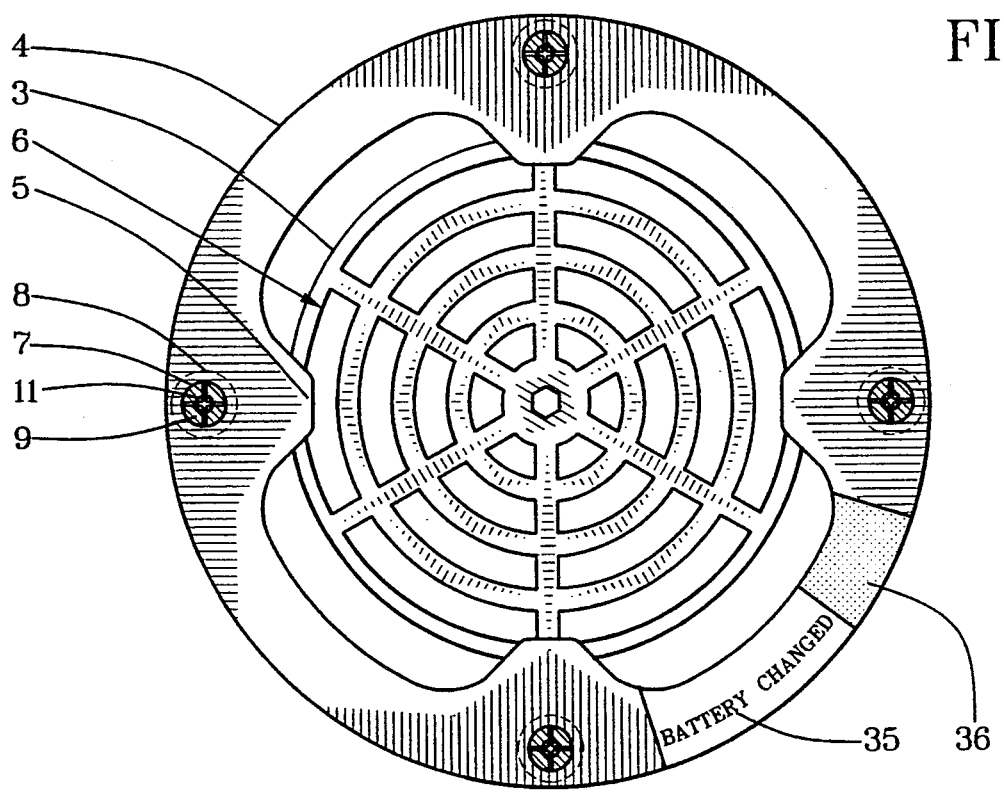
FIG. 13 is a front elevation view of a cover plate positioned over a smoke detector.

An inscription 35 related to battery-change date and a frosted section 36 for entry of a change date by pencil or other writing instrument can be positioned on an outside surface of the toroidal cover plate 4. "Frosted" describes a toughened or otherwise treated surface of hard material to receive writing with a writing instrument such as a pencil. This is illustrated in FIGS. 13–14.

Figure 14:
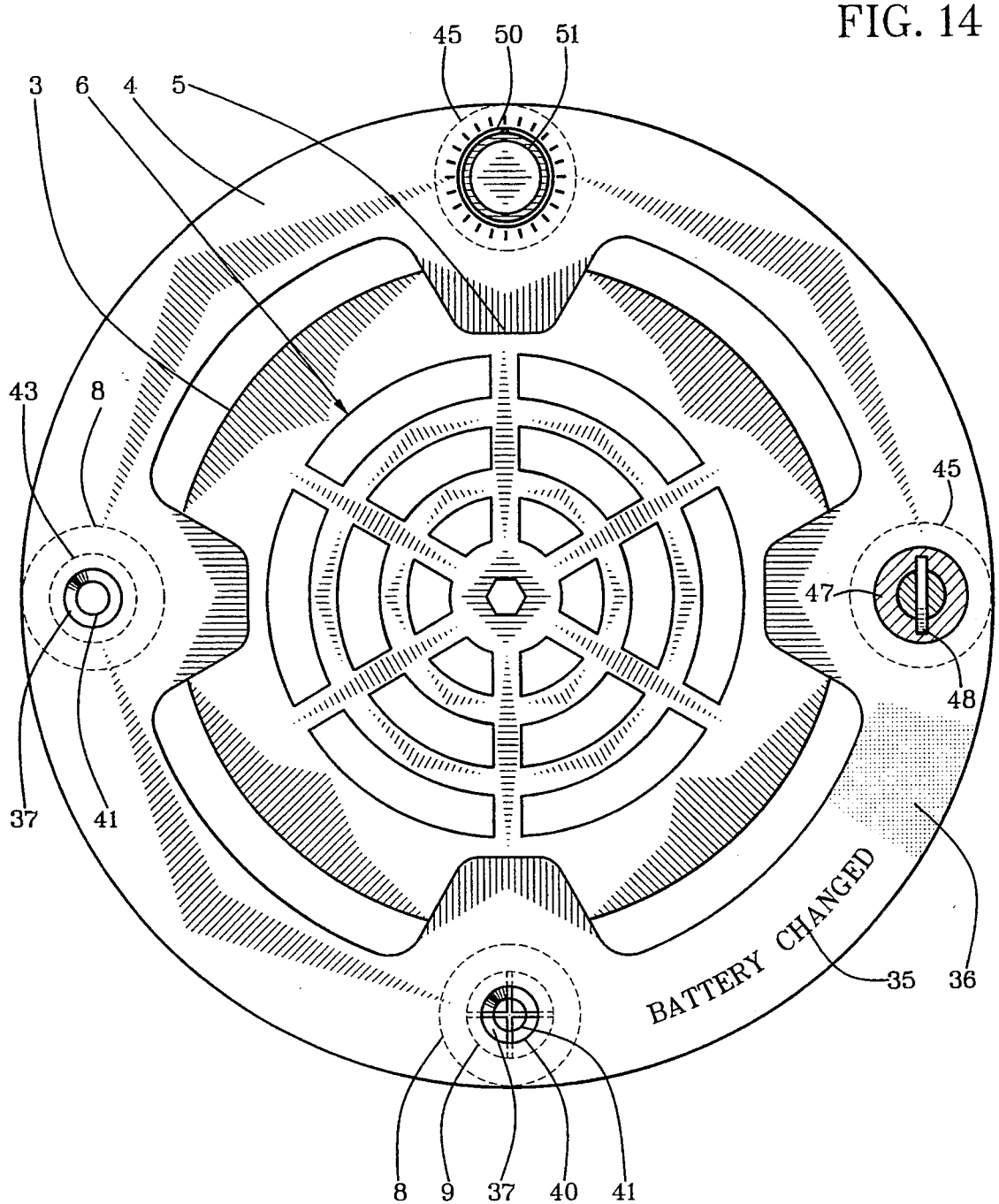
FIG. 14 is a modification of the FIG. 13 illustration demonstrating four separate anti-theft locking means.
Figure 15:
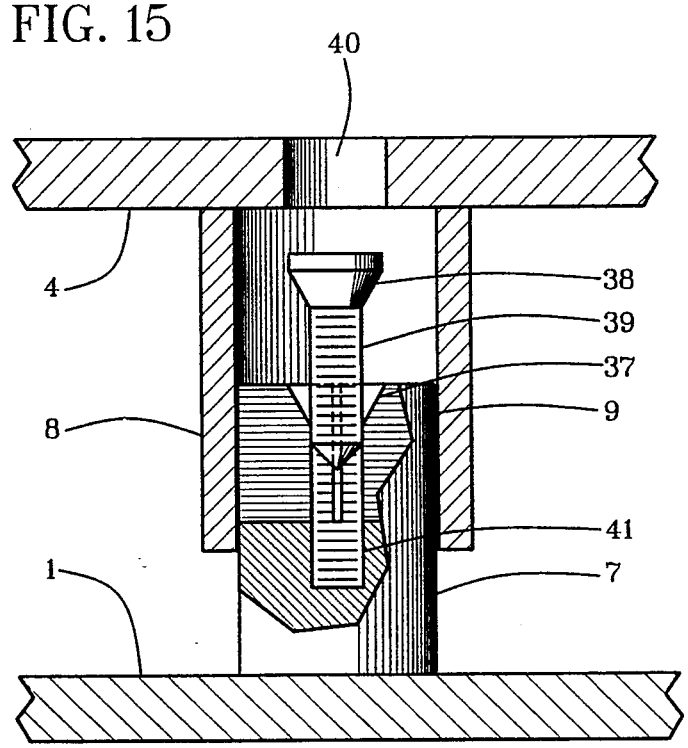
FIG. 15 is a cutaway sectional view of an anti-theft locking means comprising an attachment rod with a split end that is expandable against an inside of an attachment sleeve by means of a fastener screw with tapered head.
Figure 16:
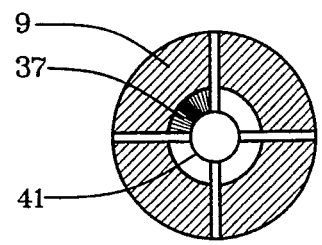
FIG. 16 is an end view of the attachment bolt in the FIG. 15 illustration.

Reference is made here to FIGS. 14–20. Four variations of the anti-theft locking means illustrated in FIGS. 1–2 and 12–13 are shown in FIG. 14. On the bottom of FIG. 14 and in FIGS. 15–16 is shown a variation with a split end 9 of the attachment rod 7 having a countersunk spread socket 37 that is tapered to receive a tapered head 38 of a straight-shank fastener 39. The straight-shank fastener 39 can be inserted through a straight cover orifice 40 that is small enough to prevent entry of larger objects that might be used otherwise for rotating the straight-shank fastener 39 without authorization. The straight-shank fastener 39 can have either of the key-wrench sockets for key wrenches described in relation to FIGS. 3–11. The split end 9 of the attachment rod 7 is spread tightly against an inside periphery of the attachment sleeve 8 by screwing a straight-threaded shank of the straight-shank fastener 39 into a straight-threaded fastener hole 41 in each attachment rod 7 for which this variation of the locking means is employed.

Figure 18:
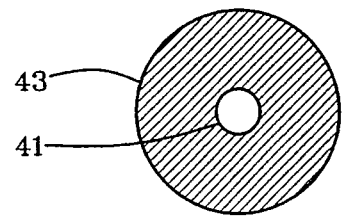
FIG. 18 is an end view of the attachment bolt in the FIG. 17 illustration.

On the left side of FIG. 4 and in FIGS. 17–18 is shown a variation of the anti-theft locking means having an attachment rod 7 without a split end 9. Instead, an anti-theft factor is achieved by positioning a straight-shank fastener 39 of a select size in a countersunk cover-plate bolt hole 42 and screwing the straight-shank fastener 39 into an un-split attachment rod 43 by rotating the tapered head 38 with an appropriate key wrench. Tightening the straight-shank fastener 39 in the straight-threaded fastener hole 41 in the un-split attachment rod 43 pulls the toroidal cover plate 4 towards the toroidal base plate 1 and tightens the retainer appendages 5 on the toroidal cover plate 4 against the smoke detector 3. To protect the contacting surfaces of the retainer appendages 5 and the smoke detector 3, the cushion pads 16 shown in FIGS. 1–2 are particularly significant for this embodiment.

Figure 19:
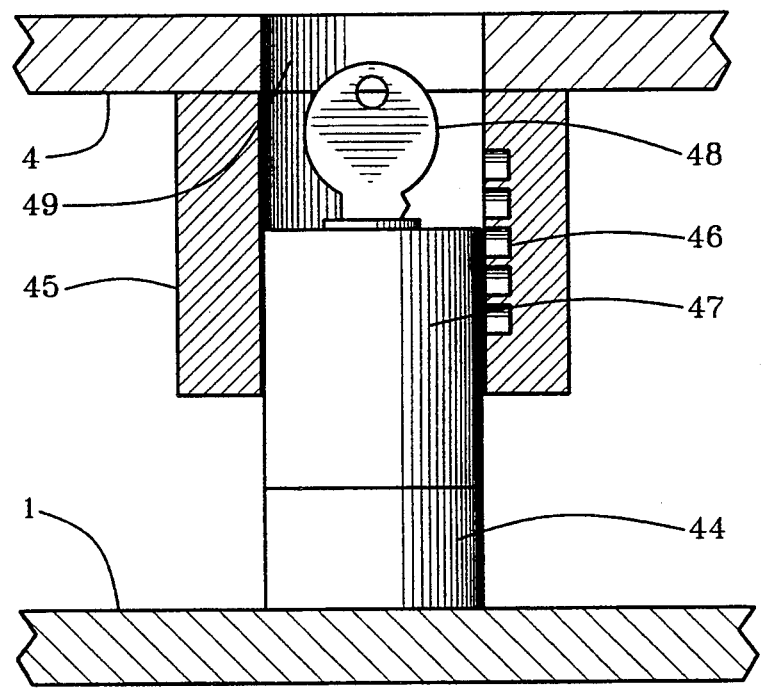
FIG. 19 is a cutaway sectional view of an anti-locking means comprising a conventional lock cylinder with a key as one of the anti-theft locking means illustrated in FIG. 14.

On the right side of FIG. 14 and in FIG. 19, is shown an anti-theft locking means comprising a lock-cylinder attachment rod 44 insertable into a lock-receptacle attachment sleeve 45. The lock-receptacle attachment sleeve 45 can have at least one lock receptacle 46 for receiving whatever locking means is extendable from a lock cylinder 47 on the lock-cylinder attachment rod 44 when the lock cylinder 47 is operated by rotation of a key 48 that is inserted in the lock cylinder 47. The lock cylinder 47 is accessible through a lock-cylinder orifice 49 in the toroidal cover plate 4 and in the lock-receptacle attachment sleeve 45.

Figure 20:
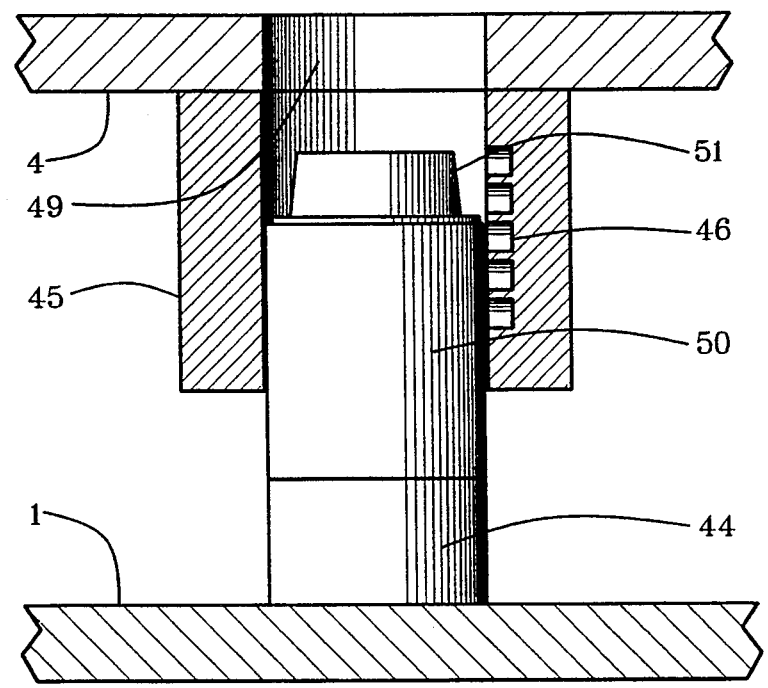
FIG. 20 is a cutaway sectional view of an anti-locking means comprising a conventional combination-lock cylinder as one of the anti-theft locking means illustrated in FIG. 14.

On the top of FIG. 14 and in FIG. 20 is shown an anti-theft locking means comprising a lock-cylinder attachment rod 44 having a combination-lock cylinder 50 that is insertable into a lock-receptacle sleeve 45 having at least one lock receptacle 46 for receiving whatever locking means is extendable from the combination-lock cylinder 50. The combination-lock cylinder 50 is operated by rotation of a combination-lock knob 51 that extends beyond the toroidal cover plate 4 when the lock-cylinder attachment rod 44 and the combination-lock cylinder 50 are inserted fully into the lock-receptacle attachment sleeve 45.

Various modifications may be made of the invention without departing from the scope thereof and it is desired, therefore, that only such limitations shall be placed thereon as are imposed by the prior art and which are set forth in the appended claims.

What is claimed is:

1. A smoke-detector security cover comprising:
   a toroidal base plate attachable to an internal surface of a room at a position surrounding a smoke detector on an internal surface of the room;
   a toroidal cover plate having a plurality of retainer appendages extended inward radially from the toroidal cover plate to positions at which select portions of the retainer appendages cover select portions of the smoke detector circumferentially external from a central smoke-detection section of the smoke detector;
   a plurality of attachment rods extended perpendicularly from the toroidal base plate a select distance relative to positioning of the toroidal cover plate;
   a plurality of attachment sleeves extended perpendicularly from the toroidal cover plate a select distance relative to positioning of the toroidal base plate;
   the plurality of attachment rods and the plurality of attachment sleeves being sized, shaped and positioned for fitting of one each of the plurality of attachment rods in sliding contact with an inside periphery of one each of the plurality of attachment sleeves telescopically; and
   an anti-theft locking means in locking relationship between at least one of the plurality of attachment rods and at least one of the plurality of attachment sleeves.

2. A smoke-detector security cover as described in claim 1 wherein the anti-theft locking means comprises:
   a diametrically split end of at least one of the plurality of attachment rods that is in sliding contact with an inside periphery of one at least one of the plurality of attachment sleeves;
   a taper-threaded fastener aperture in the at least one of the plurality of attachment rods;

a taper-threaded fastener that is threadable into the taper-threaded fastener aperture such that screwing the taper-threaded fastener tightly in the taper-threaded fastener aperture spreads the diametrically split end of the at least one of the plurality of attachment rods and engages an outside periphery of the at least one of the plurality of attachment rods tightly in contact with an inside periphery of the at least one of the plurality of attachment sleeves;

a key-wrench socket in a fastener head of the taper-threaded fastener; and a key wrench that fits into the key-wrench socket, such that screwing the taper-threaded fastener into and out of the taper-threaded fastener aperture requires insertion and rotation of an equivalent to the key wrench.

3. A smoke-detector security cover as described in claim 2 wherein the key-wrench socket in the fastener head of the taper-threaded fastener is a plurality of at least two pin holes spaced apart in a head surface of the fastener head of the taper-threaded fastener and parallel to an axis of the taper-threaded fastener;

the key wrench has a wrench boss from which are extended a plurality of pins equal to the plurality of and spaced apart equally to the plurality of at least two pin holes in the head surface of the fastener head of the taper-threaded fastener; and the plurality of pins are sized and shaped for slidable entry respectively into the plurality of at least two pin holes.

4. A smoke-detector security cover as described in claim 2 wherein the key-wrench socket in the fastener head of the taper-threaded fastener is a cavity with an internal periphery having a keyed configuration of surfaces for contact with a key wrench, and a key wrench having a wrench boss with wrench surfaces sized and shaped to fit in sliding contact with the keyed configuration of surfaces of the key-wrench socket.

5. A smoke-detector security cover as described in claim 4 wherein the keyed configuration of surfaces in the internal periphery of the cavity for contact with the key wrench is square, and the wrench boss is square.

6. A smoke-detector security cover as described in claim 4 wherein the key configuration of surfaces in the internal periphery of the cavity for contact with the key wrench is triangular, and the wrench boss is triangular.

7. A smoke-detector security cover as described in claim 4 wherein the key configuration of surfaces in the internal periphery of the cavity for contact with the key wrench is pentagonal, and the wrench boss is pentagonal.

8. A smoke-detector security cover as described in claim 4 wherein the key configuration of surfaces in the internal periphery of the cavity for contact with the key wrench has an odd plurality of sides such that no two corners are directly opposite for contact with two sides of an object such as screw driver, and the wrench boss has a matching plurality and configuration of sides.

9. A smoke-detector security cover as described in claim 4 wherein the key configuration of surfaces in the internal periphery of the cavity for contact with the key wrench has at least one side different in length from other sides of the cavity, and the wrench boss has a matching plurality and configuration of sides.

10. A smoke-detector security cover as described in claim 4 wherein the key configuration of surfaces in the internal periphery of the cavity for contact with the key wrench has a different plurality sides of equal length than employed for conventional socket wrenches, and the wrench boss has a matching plurality and configuration of sides.

11. A smoke-detector security cover as described in claim 4 wherein the key configuration of surfaces in the internal periphery of the cavity for contact with the key wrench has a plurality sides of equal lateral length that is equal to the plurality of sides employed for conventional wrench sockets, and the wrench boss has a matching plurality and configuration of sides.

12. A smoke-detector security cover as described in claim 11 wherein lateral length of the surfaces in the internal periphery of the cavity are different from standard lateral lengths of surfaces in the internal periphery of conventional wrench sockets, and the wrench boss has a matching plurality and configuration of sides.

13. A smoke-detector security cover as described in claim 2 wherein the diametrically split end of the at least one of the plurality of attachment rods is extended a distance from the toroidal base plate that positions the diametrically split end of the at least one of the plurality of attachment rods in at least one of the plurality of attachment sleeves at a select distance from an outside surface of the toroidal cover plate, such that the diametrically split end the at least one of the plurality of attachment rods is countersunk a select distance in the at least one of the plurality of attachment sleeves to prevent horizontal contact of the diametrically split end of the at least one of the plurality of attachment rods with objects which are too large for entry into the at least one of the plurality of attachment sleeves.

14. A smoke-detector security cover as described in claim 1 wherein the anti-theft locking means comprises a lock cylinder positioned axially on at least one of the plurality of attachment rods, and at least one of the plurality of attachment sleeves has an internal periphery sized and shaped to receive the lock cylinder and to receive a locking means from the lock cylinder.

15. A smoke-detector security cover as described in claim 14 and further comprising a lock key in lockable and unlockable relationship to the lock cylinder.

16. A smoke-detector security cover as described in claim 14 and further comprising a combination-lock means and combination-lock knob in lockable and unlockable relationship to the lock cylinder.

17. A smoke-detector security cover as described in claim 1 and further comprising a plurality of wall-fastener orifices in the toroidal base plate as designed for attaching the toroidal base plate to the internal surface of the room, and at least one of the plurality of wall-fastener orifices is positioned proximate an outside edge of at least one of the plurality of attachment rods such that a select portion of the at least one of the plurality of wall-fastener orifices is covered by an inside end of at least one of the plurality of attachment sleeves when the at least one of the plurality of attachment rods is positioned inside of the at least one of the plurality of fastener sleeves.

18. A smoke-detector security cover as described in claim 17 wherein the at least one of the plurality of wall-fastener orifices is positioned proximate an outside edge of the at least one of the plurality of attachment rods is countersunk into the toroidal base plate such that the inside end of the at least one of the plurality of attachment sleeves can be positioned approximately flush with an outside edge of the toroidal base plate when the toroidal cover plate is attached to the toroidal base plate, thereby to prevent unfastening of a fastener with which the toroidal base plate is attached to the interior surface of the room.

19. A smoke-detector security cover as described in claim 1 wherein the anti-theft locking means comprises:
 a diametrically split end of at least one of the plurality of attachment rods that is in sliding contact with an inside periphery of one at least one of the plurality of attachment sleeves;
 a straight-threaded fastener aperture in the at least one of the plurality of attachment rods;
 a straight-threaded fastener that is threadable into the straight-threaded fastener aperture;
 a head of the straight-threaded fastener that is tapered conically between a major and a minor diameter of the head of the straight-threaded fastener;
 a countersunk spread socket that is concentric with the straight-threaded screw aperture in the diametrically split end of the at least one of the plurality of attachment rods, such that screwing the taper-threaded fastener tightly in the straight-threaded fastener aperture spreads the diametrically split end of the at least one of the plurality of attachment rods and engages an outside periphery of the at least one of the plurality of attachment rods tightly in contact with an inside periphery of the at least one of the plurality of attachment sleeves;
 a key-wrench socket in a fastener head of the taper-threaded fastener; and
 a key wrench that fits into the key-wrench socket, such that screwing the taper-threaded fastener into and out of the taper-threaded requires insertion and rotation of an equivalent to the key wrench.

20. A smoke-detector security cover as described in claim 19 and further comprising a straight cover orifice having a design diameter of an internal periphery and positioned in the toroidal cover plate to receive the head of the straight-threaded fastener with an axis of the straight cover orifice in line concentrically with an axis of the straight-threaded fastener aperture.

21. A smoke-detector security cover as described in claim 1 wherein the anti-theft locking means comprises:
 a straight-threaded fastener aperture in the at least one of the plurality of attachment rods;
 a straight-threaded fastener that is threadable into the straight-threaded fastener aperture;
 a head of the straight-threaded fastener;
 a cover-plate fastener hole having a design diameter of an internal periphery and positioned in the toroidal cover plate to receive a shank and to prevent entry of the head of the straight-threaded fastener with an axis of the cover-plate fastener hole in line concentrically with an axis of the straight-threaded fastener aperture;
 a key-wrench socket in the fastener head of the taper-threaded fastener; and
 a key wrench that fits into the key-wrench socket, such that screwing the taper-threaded fastener into and out of the taper-threaded requires insertion and rotation of an equivalent to the key wrench.

22. A smoke-detector security cover as described in claim 21 wherein the head of the straight-threaded fastener is tapered, the cover-plate fastener hole is countersunk to receive a top of the head of the straight-threaded fastener at a position that is proximate flush with an outside surface of the toroidal cover plate, and at least one cushion pad on an inside periphery of at least one of the retainer appendages at a position of contact of the inside periphery of the at least one of the retainer appendages and a top surface of the smoke detector.

23. A smoke-detector security cover as described in claim 1 and further comprising an inscription related to battery-change date on an outside periphery of the toroidal cover plate, and a frosted section on an outside periphery of the toroidal cover plate for entry of a battery-change date.

* * * * *